(12) United States Patent
Liu et al.

(10) Patent No.: US 10,262,385 B2
(45) Date of Patent: Apr. 16, 2019

(54) METHOD AND APPARATUS FOR ACQUIRING MAGNETIC RESONANCE DATA AND ENTERING THE DATA INTO K-SPACE

(71) Applicant: Siemens Healthcare GmbH, Erlangen (DE)

(72) Inventors: Wei Liu, Shenzhen (CN); Kun Zhou, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 14/966,473

(22) Filed: Dec. 11, 2015

(65) Prior Publication Data

US 2016/0170000 A1 Jun. 16, 2016

(30) Foreign Application Priority Data

Dec. 12, 2014 (CN) .......................... 2014 1 0767038

(51) Int. Cl.
*G06K 9/00* (2006.01)
*G06T 1/00* (2006.01)
(Continued)

(52) U.S. Cl.
CPC .......... *G06T 1/0007* (2013.01); *G01R 33/561* (2013.01); *G01R 33/565* (2013.01); (Continued)

(58) Field of Classification Search
CPC ......... A61B 6/03; A61B 5/0033; A61B 5/055; A61B 6/027; G06T 2207/10088; G06T 2207/10092; G06T 2207/10096; G06T 2207/10072; G06T 2207/10076; G06T 2207/10084; G06T 2211/40; G06T 2211/421; G06T 2211/424; G06T 2211/428; G06T 2211/432; G01R 33/20; G01R 33/5608; G01N 23/046
See application file for complete search history.

(56) References Cited

U.S. PATENT DOCUMENTS 5,329,925 A * 7/1994 NessAiver ........... A61B 5/0263
324/306
5,910,728 A * 6/1999 Sodickson ......... G01R 33/3815
324/309
(Continued)

FOREIGN PATENT DOCUMENTS

CN 104181487 * 12/2014 ............. G01R 33/56
CN 104181487 B * 7/2015 ............. G01R 33/56

*Primary Examiner* — Avinash Yentrapati
(74) *Attorney, Agent, or Firm* — Schiff Hardin LLP

(57) ABSTRACT

In a method and apparatus to acquire magnetic resonance data from a subject and to enter the acquired data into k-space, data entered in an upper-half portion of k-space are acquired under a forward phase encoding gradient of the scanner so as to obtain a first portion of k-space data, and data in a lower-half portion of k-space are acquired under a reverse phase encoding gradient of the scanner so as to obtain a second portion of k-space data. The first portion of k-space data and the second portion of k-space data are combined to form complete k-space data, wherein the first portion of k-space data and the second portion of k-space data each constitute at least half of the complete k-space data.

10 Claims, 4 Drawing Sheets

(51) Int. Cl.
  *G06T 11/00* (2006.01)
  *G01R 33/561* (2006.01)
  *G01R 33/565* (2006.01)
  *G01R 33/563* (2006.01)

(52) U.S. Cl.
  CPC ...... *G06T 11/005* (2013.01); *G01R 33/56341* (2013.01); *G01R 33/56572* (2013.01); *G06T 2210/41* (2013.01)

(56) References Cited

U.S. PATENT DOCUMENTS

| | | | | |
|---|---|---|---|---|
| 5,957,843 A * | 9/1999 | Luk Pat | ............. | G01R 33/5615 324/306 |
| 6,230,039 B1 * | 5/2001 | Stuber | ............. | A61B 5/055 324/307 |
| 6,320,380 B1 * | 11/2001 | Wu | ............. | G01R 33/5615 324/307 |
| 6,694,165 B2 * | 2/2004 | Zhu | ............. | G01R 33/56341 600/410 |
| 6,700,374 B1 * | 3/2004 | Wu | ............. | G01R 33/56554 324/306 |
| 6,804,546 B1 * | 10/2004 | Thompson | ............. | G01R 33/56 324/306 |
| 7,298,143 B2 * | 11/2007 | Jaermann | ............. | G01R 33/5611 324/307 |
| 7,706,855 B1 * | 4/2010 | Priatna | ............. | A61B 5/055 324/306 |
| RE43,749 E * | 10/2012 | Miyazaki | ............. | A61B 5/7257 324/306 |
| 8,664,954 B2 * | 3/2014 | Hetzer | ............. | G01R 33/4818 324/309 |
| 2002/0032376 A1 * | 3/2002 | Miyazaki | ............. | A61B 5/0263 600/410 |
| 2006/0023835 A1 * | 2/2006 | Seppi | ............. | G01N 23/046 378/57 |
| 2011/0110486 A1 * | 5/2011 | Bouhnik | ............. | A61B 6/032 378/8 |
| 2012/0013336 A1 * | 1/2012 | Hetzer | ............. | G01R 33/4818 324/309 |
| 2015/0073263 A1 * | 3/2015 | Gdaniec | ............. | G01R 33/4818 600/413 |
| 2016/0274209 A1 * | 9/2016 | Dannels | ............. | G01R 33/4824 |

* cited by examiner

METHOD AND APPARATUS FOR ACQUIRING MAGNETIC RESONANCE DATA AND ENTERING THE DATA INTO K-SPACE

BACKGROUND OF THE INVENTION

Field of the Invention

The present invention relates to the technical field of magnetic resonance imaging (MRI), in particular a k-space data acquisition method of a magnetic resonance imaging system.

Description of the Prior Art

Magnetic resonance imaging (MRI) is a technology in which the phenomenon of magnetic resonance is utilized for the purpose of imaging. The main principles of magnetic resonance are as follows: when an atomic nucleus contains a single proton, as is the case for example with the nuclei of the hydrogen atoms that are present throughout the human body, this proton exhibits spin motion and resembles a small magnet. Moreover, the spin axes of these small magnets lack a definite pattern, and if an external magnetic field is applied, the small magnets will be rearranged according to the magnetic force lines of the external field; specifically, they will line up in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis; the atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis, the atomic nuclei have a transverse magnetization component.

Once emission of the RF pulse has ended, the excited atomic nuclei emit an echo signal, gradually releasing the absorbed energy in the form of electromagnetic waves, such that their phase and energy level both return to the pre-excitation state. An image can be reconstructed by subjecting the echo signal emitted by atomic nuclei to further processing, such as spatial encoding.

The method of echo planar imaging (EPI) is a fast magnetic resonance (MR) imaging method which exhibits geometric distortion. In applications having a short measurement time such as diffusion weighted imaging (DWI), additional time cannot be ignored; specifically, diffusion weighted imaging is based on the echo planar imaging (EPI) method (a fast MRI method).

In the compound diffusion weighted-echo planar imaging (DW-EPI) method, the technique of partial k-space acquisition is often used to reduce the echo time ($T_E$) and improve the signal-to-noise ratio (Signal Noise Ratio, SNR). In fact, the scan time can be reduced by half by acquiring slightly more than half of the complete k-space data in the phase encoding direction. The most simple and commonly used method is to reconstruct a partial k-space data set, with the unsampled part of k-space being filled with zeroes; this is also called direct zero-filling reconstruction. However, such a method will reduce image resolution and lead to obvious fuzziness in the phase encoding direction, and will sometimes also cause the Gibbs ring effect attributed to data truncation.

SUMMARY OF THE INVENTION

In view of the above, the present invention provides a k-space data acquisition method for an MRI system, that includes, in an acquisition step, operating an MRI scanner to acquired and enter data in an upper-half portion of k-space in a memory under a forward phase encoding gradient of the MRI scanner so as to obtain a first portion of k-space data, and operating the MRI scanner to acquire and enter data in a lower-half portion of k-space under a reverse phase encoding gradient of the MRI scanner so as to obtain a second portion of k-space data and, in a combining step performed in a computer have access to the memory representing k-space, combining the first portion of k-space data and the second portion of k-space data to form complete k-space data, wherein the first portion of k-space data and the second portion of k-space data each constitute at least half of the complete k-space data. The complete k-space data are made available from the computer in electronic form as a data file.

Preferably, the combining step includes filling a complementary set of the second portion of k-space data relative to the complete k-space data with the first portion of k-space data so as to form the complete k-space by combination; or filling a complementary set of the first portion of k-space data relative to the complete k-space data with the second portion of k-space data so as to form the complete k-space by combination.

Preferably, the first portion of k-space data and the second portion of k-space data each constitute more than half of the complete k-space data, wherein, in an overlap region of the first portion of k-space data and the second portion of k-space data, the first portion of k-space data includes first overlapping k-space data, and the second portion of k-space data includes second overlapping k-space data.

Preferably, the combining step then includes taking a weighted average of the first overlapping k-space data and the second overlapping k-space data to obtain weighted-average overlapping k-space data, and filling the overlap region with the weighted-average overlapping k-space data.

The present invention also provides an MRI method, wherein k-space data are acquired and entered according to any one of the k-space data acquisition methods described above.

Preferably, before the combining step, the MRI method further includes using the first overlapping k-space data and the second overlapping k-space data to subject the first portion of k-space data and the second portion of k-space data to phase correction.

Preferably, before the combining step, the MRI method further includes subjecting the first portion of k-space data and the second portion of k-space data to distortion correction.

Preferably, the k-space data are acquired by operating the MRI scanner with an echo planar imaging sequence.

The present invention also provides an MRI apparatus that has an MR scanner and a control computer that operates the MRI scanner to acquire and enter data in an upper-half portion of k-space under a forward phase encoding gradient of the MRI system so as to obtain a first portion of k-space data, and performing acquisition of data in a lower-half portion of k-space under a reverse phase encoding gradient activated by a gradient coil arrangement of MRI scanner so as to obtain a second portion of k-space data. The control computer has a combining stage configured to combine the first portion of k-space data and the second portion of k-space data to form complete k-space data, wherein the first portion of k-space data and the second portion of k-space data each constitute at least half of the complete k-space data. The complete k-space data are made available from the computer in electronic form as a data file.

Preferably, the combining is configured to fill a complementary set of the second portion of k-space data relative to the complete k-space data with the first portion of k-space data so as to form the complete k-space by combination; or fill a complementary set of the first portion of k-space data relative to the complete k-space data with the second portion of k-space data so as to form the complete k-space by combination.

Preferably, the first portion of k-space data and the second portion of k-space data each constitute more than half of the complete k-space data, wherein, in an overlap region of the first portion of k-space data and the second portion of k-space data, the first portion of k-space data includes first overlapping k-space data, and the second portion of k-space data includes second overlapping k-space data.

Preferably, the combining unit is configured to take a weighted average of the first overlapping k-space data and the second overlapping k-space data to obtain weighted-average overlapping k-space data, and fill the overlap region with the weighted-average overlapping k-space data.

Preferably, the computer also has a phase correction stage configured to use the first overlapping k-space data and the second overlapping k-space data to subject the first portion of k-space data and the second portion of k-space data to phase correction.

Preferably, the computer also has a distortion correction stage configured to subject the first portion of k-space data and the second portion of k-space data to distortion correction.

Preferably, the computer configured to operate the MRI scanner to acquire the data with an echo planar imaging method.

It can be seen from the above description that the k-space data acquisition method for an MRI system according to particular embodiments of the present invention uses forward and reverse phase encoding gradients to acquire k-space data twice, and after distortion and phase correction, omitted data can restore each other. The MRI method according to particular embodiments of the present invention is itself capable of distortion correction, because an undistorted image is in an intermediate position between two relatively distorted images. An average dimension is used to designate reverse acquisition in order to integrate a scan program and facilitate ICE reconstruction, wherein there is no need to repeat the entire standard acquisition protocol. The k-space data acquisition method for an MRI system according to particular embodiments of the present invention can be widely used with EPI sequences to ameliorate fuzziness and distortion problems, which are the main artefacts in EPI, thereby significantly improving image quality and facilitating subsequent diagnosis.

DESCRIPTION OF THE PREFERRED EMBODIMENTS

For improvement of image resolution, it is best to fill unsampled regions of k-space with non-zero values. There are various filling methods which are based on the conjugate synthesis method, such as the phase correction and conjugate synthesis (PCCS) method, the homodyne reconstruction and iterative algorithm (POCS) and the iterative partial k-space data method. However, the PCCS method will reduce image range; when image phase changes quickly, the POCS method will generate ghosts. The iterative partial k-space method gives good results, but it requires at least four iterations for convergence of data, so the complexity of calculation is increased.

Furthermore, the abovementioned methods use images with limited spatial resolution for phase correction and phase compensation, therefore some signals may be lost due to insufficient phase compensation. For example, blood vessels that are too small cannot be resolved, and signals close to air-tissue boundaries may be reduced due to rapid phase variation.

The core feature of the k-space data acquisition method for an MRI system according to a particular embodiment of the present invention is the use of the method of piecing together k-space to improve image resolution while maintaining a high signal-to-noise ratio; in addition, using two portions of k-space data, geometric distortion can also be corrected effectively through Fourier transform. Moreover, in the k-space data acquisition method according to a particular embodiment of the present invention, k-space is completely filled with non-zero values, so there is no loss of image quality and no need for a large amount of calculation.

Figure 1:
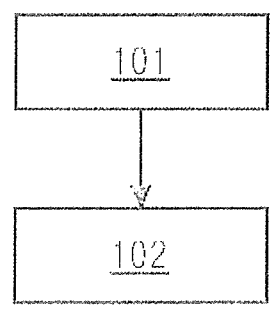
FIG. 1 shows the basic steps of the k-space data acquisition method for an MRI system according to a first embodiment of the present invention.

In order to avoid the problems of direct zero-filling reconstruction, the k-space data acquisition method according to a particular embodiment of the present invention uses non-zero values to fill unsampled parts of k-space. FIG. 1 is a step diagram of the k-space data acquisition method for an MRI system according to a particular embodiment of the present invention. As FIG. 1 shows, the k-space data acquisition method for an MRI system according to a particular embodiment of the present invention includes step 101, performing acquisition of data in an upper-half portion of k-space under a forward phase encoding gradient of the MRI system so as to obtain a first portion of k-space data, and performing acquisition of data in a lower-half portion of k-space under a reverse phase encoding gradient of the MRI system so as to obtain a second portion of k-space data; step 102, combining the first portion of k-space data and the second portion of k-space data to form complete k-space data, wherein the first portion of k-space data and the second portion of k-space data each make up at least half of the complete k-space data.

Figure 2:
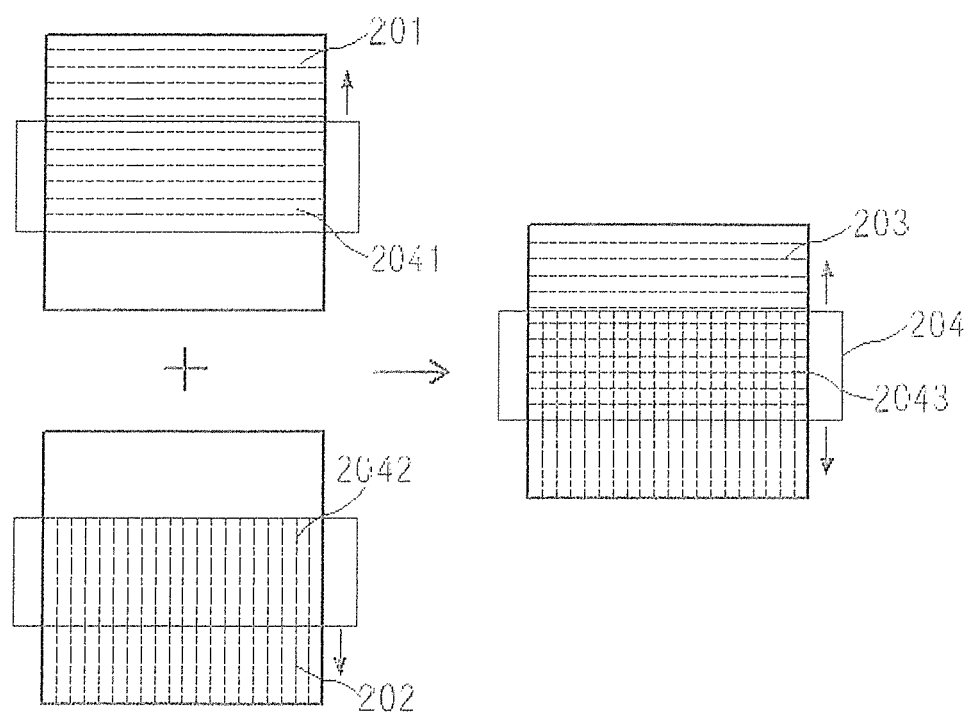
FIG. 2 schematically illustrates the k-space data acquisition method for an MRI system according to an embodiment of the present invention.

FIG. 2 is a schematic diagram of the k-space data acquisition method for an MRI system according to a particular embodiment of the present invention. Specifically, the MRI system performs double emission and acquisition for a forward phase encoding gradient and a reverse phase encoding gradient, as shown in FIG. 2, performing acquisition of data in an upper-half portion of k-space under a forward phase encoding gradient of the MRI system so as to obtain a first portion of k-space data 201, and performing acquisition of data in a lower-half portion of k-space under a reverse phase encoding gradient of the MRI system so as to obtain a second portion of k-space data 202; and in turn combining the first portion of k-space data 201 and the second portion of k-space data 202 to form complete k-space data 203, as shown in FIG. 2, wherein the first portion of k-space data 201 and the second portion of k-space data 202 each make up half or more of the complete k-space data 203.

Step 102 includes various forms of implementation; specifically, one form of implementation comprises: correspondingly filling a complementary set of the second portion of k-space data 202 relative to the complete k-space data with the first portion of k-space data 201 so as to form the complete k-space 203 by combination (i.e. correspondingly filling k-space with all of the first portion of k-space data 201, and because the remaining k-space needs to be filled, correspondingly filling the remaining k-space with the second portion of k-space data 202); or correspondingly filling a complementary set of the first portion of k-space data 201 relative to the complete k-space data with the second portion of k-space data 202 so as to form the complete k-space 203 by combination (i.e. correspondingly filling k-space with all of the second portion of k-space data 202, and because the remaining k-space needs to be filled, correspondingly filling the remaining k-space with part of the first portion of k-space data 201).

A second embodiment includes, as FIG. 2 shows, the first portion of k-space data 201 and the second portion of k-space data 202 each make up more than half of the complete k-space data, wherein, in an overlap region 204 of the first portion of k-space data 201 and the second portion of k-space data 202, the first portion of k-space data 201 comprises first overlapping k-space data 2041, and the second portion of k-space data 202 comprises second overlapping k-space data 2042.

Specifically, a weighted average is taken of the first overlapping k-space data 2041 and the second overlapping k-space data 2042 to obtain weighted-average overlapping k-space data; the overlap region 204 is filled with the weighted-average overlapping k-space data.

Figure 3:
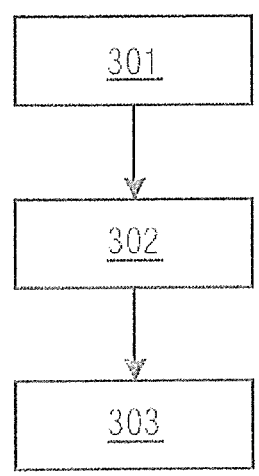
FIG. 3 shows the basic steps of an MRI method according to a second embodiment of the present invention.

FIG. 3 is a step diagram of an MRI method according to a particular embodiment of the present invention. As FIG. 3 shows, the MRI method according to this embodiment of the present invention includes step 301, performing an MRI sequence scan; step 302, acquiring k-space data; step 303, using k-space data to form an image. Step 302 may be performed using the k-space data acquisition method according to a particular embodiment of the present invention.

Specifically, taking the DW-EPI method as an example, since EPI has a relatively small effective bandwidth in the phase encoding direction, EPI is extremely sensitive to inhomogeneity in the main magnetic field $B_0$ of the MRI system, therefore distortion arising from inhomogeneity in the main magnetic field $B_0$ must be corrected. According to off-resonance polarity related to phase encoding polarity, distortion arising from inhomogeneity in the main magnetic field $B_0$ is manifested as local stretching or compression in the phase encoding direction in the acquired image.

Figure 4:
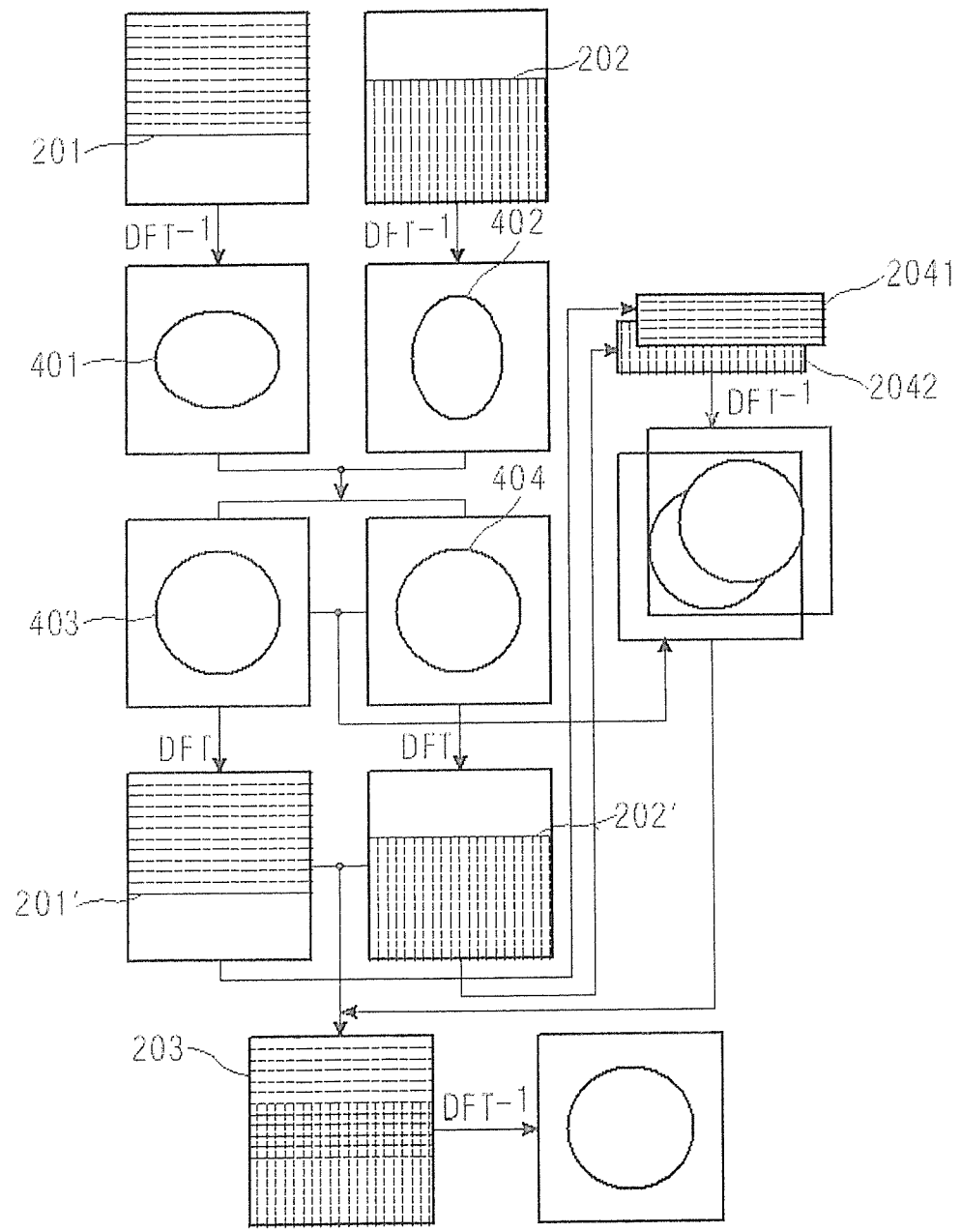
FIG. 4 schematically illustrates an MRI method according to a further embodiment of the present invention.

FIG. 4 is a schematic diagram of an MRI method according to a particular embodiment of the present invention. As FIG. 4 shows, the first portion of k-space data 201 is k-space data obtained by scanning with forward phase encoding polarity (performing acquisition of data in an upper-half portion of k-space under a forward phase encoding gradient of the MRI system so as to obtain a first portion of k-space data 201); the second portion of k-space data 202 is k-space data obtained by scanning with reverse phase encoding polarity (performing acquisition of data in a lower-half portion of k-space under a reverse phase encoding gradient of the MRI system so as to obtain a second portion of k-space data 202). The first portion of k-space data 201 and the second portion of k-space data 202 undergo inverse Fourier transform to obtain a first distorted image 401 and a second distorted image 402 respectively. As FIG. 4 shows, the first distorted image 401 and second distorted image 402 have opposite spatial distortions, i.e. opposite phase encoding gradients will lead to images having opposite distortions in the phase encoding direction, e.g. if there is local signal stretching distortion in the forward gradient image, then there will be corresponding local signal compression distortion in the reverse gradient image.

Therefore, before step 102, i.e. before the first portion of k-space data and the second portion of k-space data are combined to form complete k-space data, distortion between the first distorted image 401 and the second distorted image 402 is removed. Specifically, taking the DW-EPI method as an example, the first distorted image 401 and second distorted image 402 are subjected to distortion correction. The specific method is as follows:

The spatial coordinates of a real image are u and v, while the spatial coordinates of the first distorted image 401 and the second distorted image 402 are $(x,y)_+$ and $(x,y)_-$, which can be expressed as formula [1]:

$$(x,y)_+ = T_+(u,v) = (u, v-d(u,v))$$

$$(x,y)_- = T_-(u,v) = (u, v+d(u,v)) \quad [1]$$

wherein $T_+(u,v)$ and $T_-(u,v)$ are mapping relationships from the real image spatial coordinates to the spatial coordinates of the first distorted image 401 and the second distorted image 402, respectively, and $d(u,v)$ is a pixel offset in the phase encoding gradient direction of the real image.

According to formula [1], the spatial coordinates u and v of the real image and the pixel offset $d(u,v)$ in the phase encoding gradient direction of the real image are obtained, then a first corrected image 403, i.e. $I_+(u,v)$, and a second corrected image 404, i.e. $I_-(u,v)$, are obtained according to the above three quantities:

$$I_+(u,v) = \left(1 - \frac{\partial d}{\partial v}\right) I_+(u, v - d(u,v)) \quad [2]$$

$$I_-(u,v) = \left(1 + \frac{\partial d}{\partial v}\right) I_-(u, v + d(u,v))$$

wherein $I_+(u, v-d(u,v))$ and $I_-(u, v+d(u,v))$ are the first distorted image 401 and second distorted image 402.

The first corrected image 403, i.e. $I_+(u,v)$ and the second corrected image 404, i.e. $I_-(u,v)$, are subjected to Fourier transform to obtain a corrected first portion of k-space data 201' and a corrected second portion of k-space data 202', then the corrected first portion of k-space data 201' and the corrected second portion of k-space data 202' are combined to obtain complete k-space data 203.

In MRI, there is a non-linear phase error between signals generated by different excitations, leading to serious image artefacts. Taking diffusion weighted imaging with multiple excitations as an example, the first portion of k-space data and the second portion of k-space data must be subjected to phase correction before the k-space data is combined. The specific method is as follows:

The first portion of k-space data and the second portion of k-space data are $M_1(kx, ky)$ and $M_2(kx, ky)$ respectively; first overlapping k-space data and second overlapping k-space data are $Mo_1(kx, ky)$ and $Mo_2(kx, ky)$ respectively. kx and ky are the coordinates in k-space of each k-space datum.

Since a large phase error will increase the width Wx of the k-space signal distribution, as shown in formula [3], $$W_x = \Sigma_{ky} \Sigma_{kx} |M_i(kx, ky)| \cdot |kx - \Omega_x| \qquad [3]$$

wherein $M_i$ is the complex representation of k-space data and $\Omega_x$ is kx of the k-space data with the maximum signal strength, an image obtained from k-space data of an overlap region with a relatively small Wx is chosen as a reference image.

Next, the first overlapping k-space data $Mo_1(kx,ky)$ and second overlapping k-space data $Mo_2(kx,ky)$ are subjected to Fourier transform after zero-filling to obtain a first overlap image $Mo_1(x,y)$ and a second overlap image $Mo_2(x,y)$, wherein x and y are image field coordinates. Before the Fourier transform which follows zero-filling, Hanning filtering must be carried out in the ky direction so as to minimize truncation artefacts.

Finally, in this particular embodiment, a first overlap image $Mo_1$ can be used as a reference image (i.e. an image obtained from k-space data of an overlap region with a relatively small Wx is used as a reference image), a phase of the reference image $Mo_1(x,y)$ is used to replace a phase of a second overlap image $Mo_2(x,y)$ at a corresponding position, then the first overlap image $Mo_1(x,y)$ and the corrected second overlap image $Mo_2(x,y)$ are transformed to k-space to obtain corrected second overlapping k-space data $M'o_2(kx,ky)$, and a phase of the corrected second overlapping k-space data $M'o_2$ is used to replace a phase of the second portion of k-space data $M_2(kx,ky)$, so that the first portion of k-space data and the second portion of k-space data have the same phase difference.

In order to reduce the echo time and increase the signal-to-noise ratio in a magnetic resonance image (especially a DW-EPI image), the k-space data acquisition method for an MRI system according to a particular embodiment of the present invention conservatively sets the phase partial Fourier (PPF) factor to be 6/8 so as to ensure stable partial k-space reconstruction. In the present invention, image fuzziness caused by zero-filling in partial k-space reconstruction will be improved through the piecing together of k-space while maintaining the same or a lower echo time. The coverage in k-space can be reduced to 5/8; at the same time, distortion induced by inhomogeneity in the main magnetic field $B_0$ of the MRI system can be reduced. Moreover, integrated double emission and acquisition using a reverse gradient will facilitate subsequent reconstruction in ICE.

The k-space data acquisition method for an MRI system according to particular embodiments of the present invention uses forward and reverse phase encoding gradients to acquire k-space data twice, and after distortion and phase correction, omitted data can restore each other. The MRI method according to particular embodiments of the present invention is itself capable of distortion correction, because an undistorted image is in an intermediate position between two relatively distorted images. An average dimension is used to designate reverse acquisition in order to integrate a scan program and facilitate ICE reconstruction, wherein there is no need to repeat the entire standard acquisition protocol. Finally, the k-space data acquisition method for an MRI system according to particular embodiments of the present invention can be widely used with EPI sequences to ameliorate fuzziness and distortion problems, which are the main artifacts in EPI, thereby significantly improving image quality and facilitating subsequent diagnosis.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising:

operating a magnetic resonance scanner in order to execute a diffusion weighted echo planar imaging (DW-EPI) sequence so as to acquire DW-EPI magnetic resonance data from a subject situated into the scanner and entering the acquired DW-EPI magnetic resonance data into an electronic memory representing k-space;

activating a forward phase encoding gradient in said scanner while acquiring a portion of said DW-EPI magnetic resonance data, and entering the portion of DW-EPI magnetic resonance data acquired during said forward phase encoding gradient into lines in an upper-half portion of k-space, thereby obtaining a first portion of k-space data;

activating a reverse phase encoding gradient in said scanner, which has a 180° phase difference compared to said forward phase encoding gradient, while acquiring a portion of said DW-EPI magnetic resonance data, and entering the portion of DW-EPI magnetic resonance data acquired during said reverse phase encoding gradient into lines in a lower-half portion of k-space, thereby obtaining a second portion of k-space data;

entering said first and second portions of k-space data into k-space so that said first portion of k-space data and said second portion of k-space data each constitute more than half of said complete k-space data, and so as to produce an overlap region of said first portion of k-space data and said second portion of k-space data in k-space, so that said first portion of k-space data comprises multiple lines of first overlapping k-space data that are in said overlap region and said second portion of k-space data comprises multiple lines of second overlapping k-space data that are also in said overlap region;

in a computer having access to said memory, using said first overlapping k-space data and said second overlapping k-space data to subject said first portion of k-space data and second portion of k-space data to at least one of DW-EPI phase correction and DW-EPI distortion correction, thereby producing a first portion of corrected k-space data and a second portion of corrected k-space data;

in said computer, combining said first portion of corrected k-space data and said second portion of corrected k-space data to form complete corrected k-space data; and making the complete corrected k-space data available from the computer in electronic form as a data file.

2. A method as claimed in claim 1 comprising combining said first portion of corrected k-space data and said second portion of corrected k-space data by one of:

filling a complementary set of said second portion of corrected k-space data relative to said complete corrected k-space data with said first portion of corrected k-space data, so as to form the complete corrected k-space data; or filling a complementary set of said first portion of corrected k-space data relative to said complete corrected k-space data with said second portion of corrected k-space data, so as to form said complete corrected k-space.

3. A method as claimed in claim 1 comprising, in said computer, reconstructing a magnetic resonance image of the subject from said complete corrected k-space data.

4. A method as claimed in claim 1 comprising combining said first portion of corrected k-space data and said second portion of corrected k-space data by:

obtaining a weighted average of said first overlapping k-space data and said second overlapping k-space data to obtained weighted-average overlapping k-space data; and filling said overlapping region of k-space with said weighted average overlapping k-space data.

5. A method as claimed in claim 4 comprising, in said computer, reconstructing a magnetic resonance image of the subject from said complete corrected k-space data.

6. A magnetic resonance apparatus comprising:

a magnetic resonance scanner;

an electronic memory;

a computer configured to operate said magnetic resonance scanner in order to execute a diffusion weighted echo planar imaging (DW-EPI) sequence so as to acquire DW-EPI magnetic resonance data from a subject situated into the scanner and to enter the acquired DW-EPI magnetic resonance data into said electronic memory, representing k-space in said memory;

said computer being configured to activate a forward phase encoding gradient in said scanner while acquiring a portion of said DW-EPI magnetic resonance data, and entering the portion of DW-EPI magnetic resonance data acquired during said forward phase encoding gradient into an upper-half portion of k-space, thereby obtaining a first portion of k-space data;

said computer being configured to activate a reverse phase encoding gradient, which has a 180° phase difference compared to said forward phase encoding gradient, in said scanner while acquiring a portion of said DW-EPI magnetic resonance data, and to enter the portion of DW-EPI magnetic resonance data acquired during said reverse phase encoding gradient into a lower-half portion of k-space in said memory, thereby obtaining a second portion of k-space data;

said computer being configured to enter said first and second portions of k-space data into k-space in said memory so that said first portion of k-space data and said second portion of k-space data each constitute more than half of said complete k-space data, and so as to produce an overlap region of said first portion of k-space data and said second portion of k-space data in k-space, so that said first portion of k-space data comprises multiple lines of first overlapping k-space data that are in said overlap region and said second portion of k-space data comprises second overlapping k-space data that are also in said overlap region;

said computer being configured to use said first overlapping k-space data and said second overlapping k-space data to subject said first portion of k-space data and second portion of k-space data to at least one of DW-EPI phase correction and DW-EPI distortion correction, thereby producing a first portion of corrected k-space data and a second portion of corrected k-space data;

said computer being configured to combine said first portion of corrected k-space data and said second portion of corrected k-space data to form complete corrected k-space data; and said computer being configured to make the complete corrected k-space data available from the computer in electronic form as a data file.

7. An apparatus as claimed in claim 6 wherein said computer is configured to combine said first portion of corrected k-space data and said second portion of corrected k-space data by one of:

filling a complementary set of said second portion of corrected k-space data relative to said complete corrected k-space data with said first portion of corrected k-space data, so as to form the complete corrected k-space data; or filling a complementary set of said first portion of corrected k-space data relative to said complete corrected k-space data with said second portion of corrected k-space data, so as to form said complete corrected k-space data.

8. An apparatus as claimed in claim 6 wherein said computer is configured to reconstruct a magnetic resonance image of the subject from said complete k-space data.

9. An apparatus as claimed in claim 6 wherein said computer is configured to combine said first portion of corrected k-space data and said second portion of corrected k-space data by:

obtaining a weighted average of said first overlapping k-space data and said second overlapping k-space data to obtained weighted-average overlapping k-space data; and filling said overlapping region of k-space with said weighted average overlapping k-space data.

10. An apparatus as claimed in claim 9 wherein said computer is configured to reconstruct a magnetic resonance image of the subject from said complete corrected k-space data.

* * * * *